Figure 1:
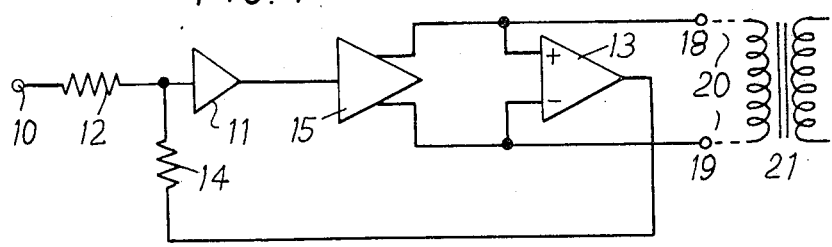

United States Patent [19]

Gundry

[11] 3,997,850
[45] Dec. 14, 1976

[54] FLOATING ELECTRICAL OUTPUT CIRCUIT

[75] Inventor: Kenneth James Gundry, London, England

[73] Assignee: Dolby Laboratories, Inc., San Francisco, Calif.

[22] Filed: Feb. 13, 1975

[21] Appl. No.: 549,679

Related U.S. Application Data

[63] Continuation of Ser. No. 395,609, Sept. 10, 1973, abandoned.

[52] U.S. Cl. .................................. 330/25; 330/28; 330/30 D; 330/85; 333/14
[51] Int. Cl.[2] ...................... H03F 1/08; H03G 3/30
[58] Field of Search ............. 330/25, 28, 30 D, 69, 330/85, 86, 149; 333/14

[56] References Cited

UNITED STATES PATENTS

| | | | |
|---|---|---|---|
| 3,497,822 | 2/1970 | Beurrier | 330/30 D X |
| 3,825,854 | 7/1974 | Pichal | 330/85 X |
| R27,351 | 5/1972 | McGraw et al. | 330/69 X |

Primary Examiner—R. V. Rolinec
Assistant Examiner—Lawrence J. Dahl
Attorney, Agent, or Firm—Robert F. O'Connell

[57] ABSTRACT

In a floating electrical output circuit according to copending application Ser. No. 395,608, now U.S. Pat. No. 3,909,737, issued Sept. 30, 1975, two load terminals are driven from amplifying means having differential current outputs. A differential amplifier connected across the load terminals provides a feedback signal which is compared with the input signal to provide a control signal for the amplifying means.

In the present invention the amplifying means are simplified to a single differential current amplifier.

2 Claims, 2 Drawing Figures

FLOATING ELECTRICAL OUTPUT CIRCUIT

This is a continuation of application Ser. No. 395,609, filed on Sept. 10, 1973, now abandoned.

This invention relates to a transformerless floating electrical output circuit and concerns an improvement of the circuit described and claimed in co-pending application Serial No. in the name of Ray M. Dolby, corresponding to British Application No. 42350/72 and assigned to common assignee, the disclosure of which is incorporated herein by reference.

According to the referenced application, a floating electrical output circuit comprises means for comparing an input signal with a feedback signal to derive a control signal, means for driving amplifying means having differential current outputs from the control signal, the amplifier outputs being coupled to a pair of load terminals across which is further coupled an amplifier circuit whose output is proportional to the voltage between the load terminals and which provides the feedback signal to the comparing means.

In the improvement of the present invention, the amplifying means consists of a single differential current amplifier, in contrast to the use of two separate amplifiers operating in anti-phase as disclosed in the referenced application. This provision simplifies the circuit and also facilitates establishing stable conditions with the correct balance between the two halves of the amplifying means.

Figure 2:
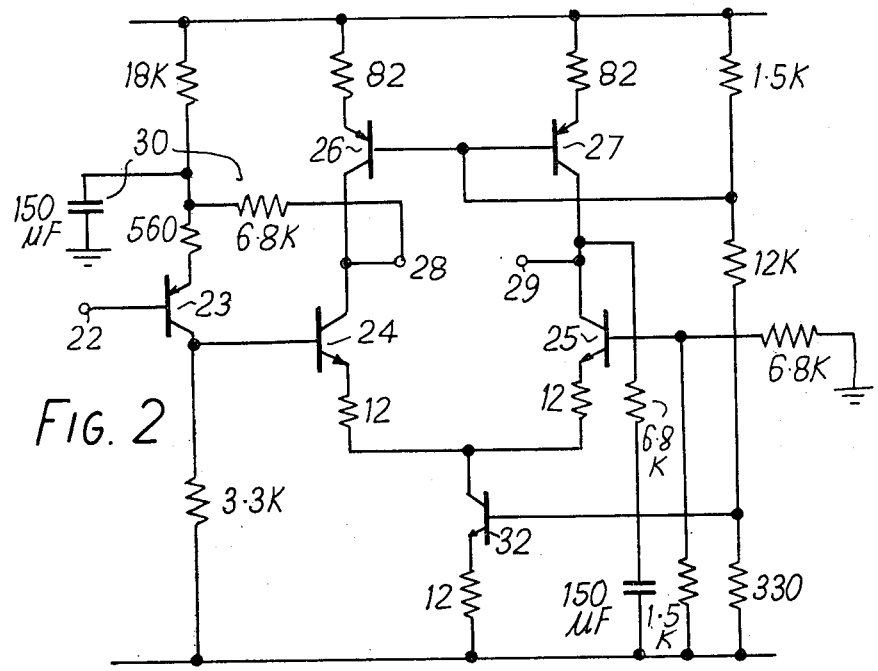

The invention and its mode of operation will be described in more detail, by way of example, with reference to the accompanying drawings, in which:

FIG. 1 is a block diagram of the general circuit according to the referenced application, and FIG. 2 is a circuit diagram of the improved amplifying means of the present application, as suitable for an audio frequency circuit.

In FIG. 1 an input terminal 10 is connected to a summing amplifier 11 through an input resistor 12. A feedback signal provided by a differential amplifier 13 is fed to the amplifier 11 through a resistor 14 and the sense of the feedback signal from the differential amplifier is arranged to be opposite to that of the input signal. A control signal proportional to the difference between the input signal and the feedback signal therefore appears at the output of the amplifier 11. It will be appreciated that other means, e.g. a differential amplifier, could be used to compare the input signal and feedback signal to derive the control signal.

One input of a differential current amplifier 15 is driven by the control signal, the other input (not shown) being tied to a reference potential. The amplifier 15 provides differential current outputs and the outputs of the current amplifier are connected to respective load terminals 18 and 19, to which the inputs of the differential amplifier 13 are connected. The load impedance may be that presented by a floating output line 20 connected, for example, to a transformer-coupled input stage 21 of an entirely different piece of electrical equipment.

Irrespective of the value of the load impedance (within a working range) the feedback connection will so regulate the control signal that the differential currents supplied by the amplifier 15 produce a load voltage, and hence a differential amplifier output voltage, matching the input voltage. This condition obtains whether or not the terminals 18 and 19 are entirely floating or whether, as may sometimes be desired, one of these terminals is tied to a point of arbitrary potential, e.g. by way of one conductor of the line 20.

The input and output voltages are not necessarily equal; a constant of proportionality may be introduced if the differential amplifier 13 has other than unity gain or by suitably proportioning the resistors 12 and 14.

According to the present invention, the amplifier 15 may take the form shown in FIG. 2. An input terminal 22 drives an amplifying transistor 23 operating in the common emitter mode. The collector of the transistor is connected to one input of a long-tailed pair of transistors 24 and 25 with a constant current source 32 in their emitter circuit. The other input, i.e. the base of transistor 25, is held at a constant potential. The transistors 24 and 25 have as collector loads two constant current sources (transistors 26 and 27), and hence provide a differential current output to terminals 28 and 29, which correspond to the terminals 18 and 19 of FIG. 1. D.C. feedback from terminal 28, applied via low pass filter 30 to the emitter of transistor 23, stabilizes the static potential of terminal 28, the resistor values being chosen so that terminal 28 is at ground potential when terminal 22 is grounded.

I claim:
1. A floating electrical output circuit comprising means for comparing an input signal with a feedback signal to derive a drive signal,
a differential current amplifier having two current paths fed in parallel from a constant current source common to the two paths and an input coupled to the output of said comparing means, two outputs coupled to said paths respectively and being responsive to said drive signal for varying the currents in the said paths differentially and providing differential current outputs at said two outputs respectively,
a pair of floating load terminals coupled to said outputs of said differential current amplifier means, and
a feedback amplifier circuit coupled across said load terminals to provide said feedback signal proportional to the voltage between said load terminals.

2. A circuit according to claim 1, comprising a negative feedback circuit incorporating smoothing means connected between one of the outputs of the differential current amplifier and the said first input.

* * * * *